US010374551B2

(12) United States Patent
Kazakevich et al.

(10) Patent No.: US 10,374,551 B2
(45) Date of Patent: Aug. 6, 2019

(54) SUBCRITICAL-VOLTAGE MAGNETRON RF POWER SOURCE

(71) Applicant: Muons, Inc., Batavia, IL (US)

(72) Inventors: Grigory M. Kazakevich, North Aurora, IL (US); Michael L. Neubauer, San Francisco, CA (US); Valeri A. Lebedev, Wheaton, IL (US); Vyacheslav P. Yakovlev, Batavia, IL (US)

(73) Assignee: Muons, Inc., Batavia, IL (US)

( * ) Notice: Subject to any disclaimer, the term of this patent is extended or adjusted under 35 U.S.C. 154(b) by 343 days.

(21) Appl. No.: 15/430,497

(22) Filed: Feb. 12, 2017

(65) Prior Publication Data

US 2017/0250651 A1 Aug. 31, 2017

Related U.S. Application Data

(60) Provisional application No. 62/388,973, filed on Feb. 12, 2016.

(51) Int. Cl.
*H05H 7/02* (2006.01)
*H03B 9/10* (2006.01)

(52) U.S. Cl.
CPC ............ *H03B 9/10* (2013.01); *H05H 7/02* (2013.01); *H05H 2007/025* (2013.01)

(58) Field of Classification Search
CPC ........................................... H03B 9/10
See application file for complete search history.

(56) References Cited

U.S. PATENT DOCUMENTS

| 2,576,108 | A | 11/1951 | Engelmann | |
|---|---|---|---|---|
| 2,620,467 | A | 12/1952 | Donal, Jr. | |
| 3,448,330 | A * | 6/1969 | Farney | H01J 25/46 315/3.6 |
| 2017/0280549 | A1* | 9/2017 | Chase | G01P 15/00 |

FOREIGN PATENT DOCUMENTS

| GB | 541120 A | 11/1941 |
|---|---|---|
| GB | 2235775 A | 3/1991 |

OTHER PUBLICATIONS

Chase, B., et al., "Precision vector control of a superconducting RF cavity driven by an injection locked magnetron", *2015 Journal of Instrumentation 10 P03007*, (2015), 14 pgs.

(Continued)

*Primary Examiner* — Jeffrey M Shin
(74) *Attorney, Agent, or Firm* — Schwegman Lundberg & Woessner, P.A.

(57) ABSTRACT

A system and method of operating a magnetron power source can achieve a broad range of output power control by operating a magnetron with its cathode voltage lower than that needed for free running oscillations (e.g., below the Kapitsa critical voltage or equivalently below the Hartree voltage) A sufficiently strong injection-locking signal enables the output power to be coherently generated and to be controlled over a broad power range by small changes in the cathode voltage. In one embodiment, the present system and method is used for a practical, single, frequency-locked 2-magnetron system design.

20 Claims, 6 Drawing Sheets

(56) References Cited

OTHER PUBLICATIONS

Collins, G. B., et al., *Microwave Magnetrons*, McGraw-Hill Book Co., New York, NY, (1948), 1-806.
Kapitza, P. L., "High Power Electronics", *Soviet Physics Uspekhi*, vol. 5, No. 5, (1963), 777-826.
Kazakevich, G., et al., "A Novel Technique of Power Control in Magnetron Transmitters for Intense Accelerators", TUA2CO03, *Proceedings NAPAC 2016 Conference*, Chicago, IL, (2016), 271-274.
Kazakevich, G., et al., "High-Power Magnetron RF Source for Intensity-Frontier Superconducting Linacs", EIC 2014, TUDF1132_TALK [online]. Retrieved from the Internet: <URL:// http://appora.fnal.gov/pls/eic14/agenda.full>, (2014), 24 pgs.
Kazakevich, Gregory, et al., "An efficient magnetron transmitter for superconducting accelerators", *Nuclear Instruments and Methods in Physics Research Section A*, vol, 839, (2016), 43-51.
Kazakevich, Gregory, et al., "High-power magnetron transmitter as an RF source for superconducting linear accelerators", *Nuclear Instruments and Methods in Physics Research Section A*, vol. 760, (2014), 19-27.

* cited by examiner

SUBCRITICAL-VOLTAGE MAGNETRON RF POWER SOURCE

CROSS REFERENCE TO RELATED APPLICATIONS

This patent application claims the benefit of priority under 35 U.S.C. § 119(e) of U.S. Provisional Patent Application Ser. No. 62/388,973, entitled "Magnetron power source for superconducting RF cavities", filed on Feb. 12, 2016.

The names of the parties to a joint research agreement if the claimed invention was made as a result of activities within the scope of a joint research agreement.

The invention and work described here were made under CRADA FRA-2011-0004 between Muons, Inc. and the Fermi Research Alliance, LLC, which operates the Fermi National Accelerator Laboratory.

REFERENCE TO A SEQUENCE LISTING

Not Applicable

STATEMENT REGARDING PRIOR DISCLOSURES BY THE INVENTOR OR A JOINT INVENTOR

Not Applicable

STATEMENT OF FEDERALLY SPONSORED RESEARCH OR DEVELOPMENT

This invention was made with government support under STTR Grant DE-SC0006261 awarded to Muons, Inc. by the US DOE. The government has certain rights in the invention.

BACKGROUND OF THE INVENTION

This invention relates generally to the field of RF power generation, for applications including but not limited to particle accelerators. This invention relates particularly to the control of magnetron power sources for applications that require efficient regulation of output RF power and its phase over a broad range of amplitudes and phases. Usual magnetron power sources operate as oscillators, with constant output power provided by a regulated cathode voltage power source. To generate RF power matched to the frequency of an intended load, an injection phase-locking signal RF signal is fed into the magnetron through the magnetron output antenna. This is the usual operating mode for phase-locked magnetron RF power sources. However, to generate RF power matched to the power of a variable intended load, the usual technique is to divert some of the output power from the constant output power of the usual magnetron to a water-cooled dummy load.

BRIEF SUMMARY OF THE INVENTION

The invention described in this application is a new method of operating a magnetron power source to achieve a broad range of output power control. Operating a magnetron with the cathode voltage lower than that needed for free running oscillations, (below the Kapitza critical voltage or equivalently below the Hartree voltage), a sufficiently strong injection phase-locking signal enables the output power to be generated and to be controlled over a broad power range by small changes in the cathode voltage.

This new magnetron operation method is demonstrated in FIG. 1, which shows the measured operating parameters of a 2.45 GHz magnetron operating with a fixed magnetic field. The abscissa is the voltage on the cathode and the ordinate is the output power of the magnetron. The data circles and line on the right of the figure show the operating range of voltage and power for the case of no injection-locking signal, where the lowest voltage corresponds to the critical or Hartree voltage which enables the magnetron to operate and to produce power. The data squares and line on the left of the figure show the operating range of voltage and power that correspond to an injection phase-locking signal of 53.9 W power. While the operation with no injection-locking signal has an output power range of 60 W (from 400 to 460 W), operation with a 53.9 W injection locking signal has an output power range of 250 W (from 300 to 450 W). It is also important to note that a 0.15 kV/3.5 kV=4% increase in cathode voltage increases the output power by 150 W/300 W=50%. These are the features of subcritical-voltage operation that the invention exploits. Namely, given a significantly powerful injection-locking signal, subcritical-voltage magnetron RF power sources have a broad range of power control with relatively small change in cathode voltage.

PREFERRED EMBODIMENT

A 2-Stage Magnetron System for Innovative Power Control with Highest Efficiency

The high-power RF source concept presented in this preferred embodiment is based on a single, frequency-locked 2-stage magnetron system. It is controlled in the first magnetron in phase over a wide band by a phase—modulated injection—locking signal and controlled in power in the range up to 10 dB in the second magnetron by a high-voltage cathode power supply within a fast feedback loop. The range of control satisfies the requirements of superconducting RF accelerators. The cost-effective 2-stage magnetron system is shown schematically in FIG. 2. In this embodiment, the first low-power magnetron operates in a nominal regime and is frequency-locked by a driving system within a phase feedback loop. It provides the required injection-locking signal for the wideband phase control of the subcritical voltage high-power magnetron. This phase control is realized by phase modulation of the input injection-locking signal, as it was demonstrated in Ref. [2]. The high-power magnetron is driven by a sufficient (−10 dB of the magnetron nominal power injection-locking signal to operate stably with a subcritical voltage on the cathode [4]. This allows control of the power of the high-power magnetron over an extended range by varying the current of the tube by a HV power supply within a feedback loop. Thus one can achieve quite fast power control in the range of 10 dB with highest efficiency, avoiding redistribution of the RF power into a dummy load, [4, 5].

DETAILED DESCRIPTION OF THE INVENTION

Figure 1:
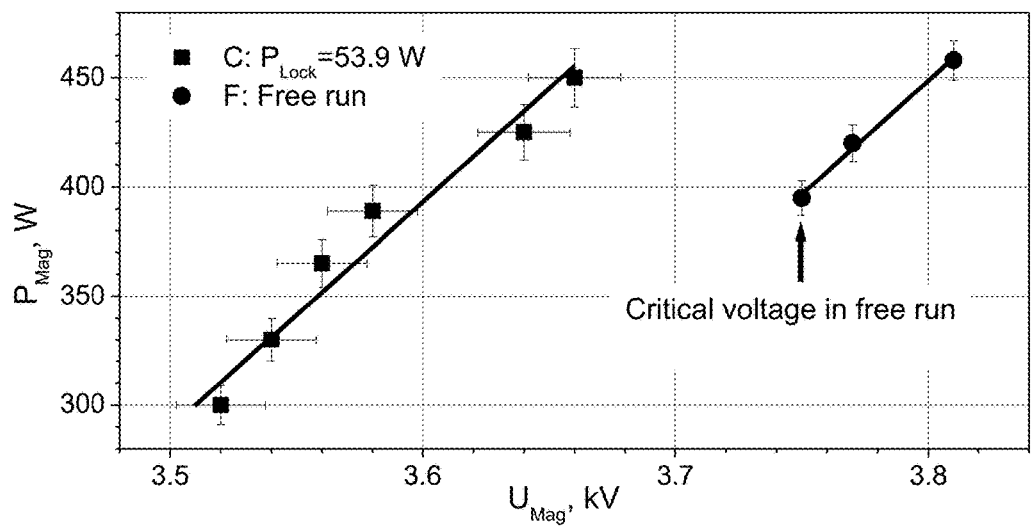
FIG. 1 is the measured dependence of power of a 2.45 GHz, 1 kW, CW magnetron on the cathode voltage with 53.9 W injected resonant (injection-locking) signal (squares), and in the free running mode with no injection locking signal (circles). Solid lines are linear fits showing the range of coherent magnetron operation for the indicated conditions.
Figure 2:
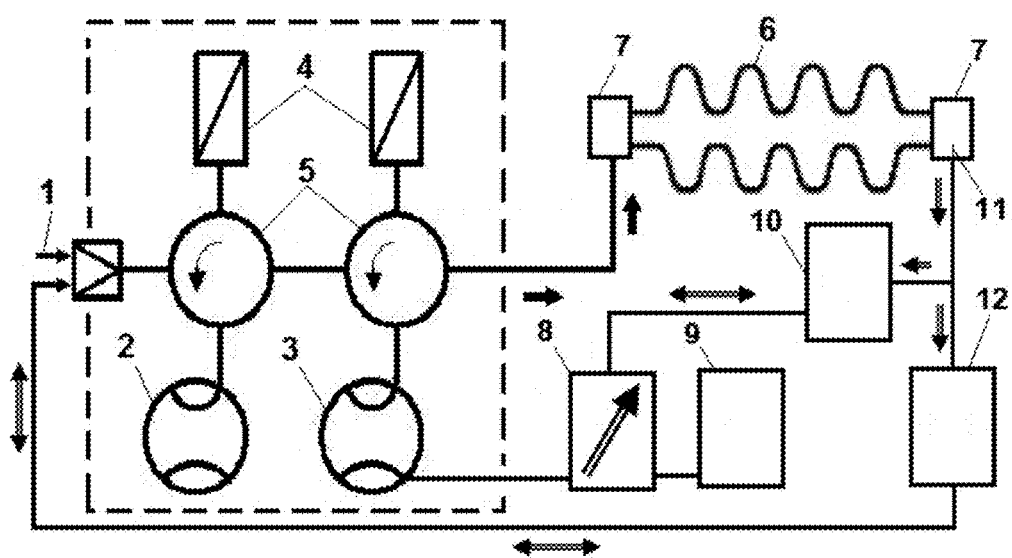
FIG. 2 is a conceptual drawing of the 2-stage magnetron embodiment for wide-band phase and mid-frequency power control over a 10 dB range for an RF cavity. By numbers are depicted: 1—input driving resonant RE signal, 2—low-power magnetron driven by the resonant injected signal, 3—high-power injection-locked magnetron controlled by cathode voltage, 4—power loads, 5—ferrite circulators, 6—an accelerating cavity driven by the high-power magnetron, 7—RE couplers, 8—low-power HV power supply controlled within a feedback loop, 9—main HV power supply, 10—current/voltage controller within the Low Level RF system (LLRF) for the low-power power supply, 11—RF probe, 12—phase controller within the LLRF. The heavy lines with arrows indicate the direction of information or power flow.

The embodiment of a high-power RF source powering a superconducting RF cavity is based on a single, frequency-locked 2-cascade magnetron system. It is controlled in phase over a wide band by a phase-modulated injection-locking signal and controlled in power in the range up to 10 dB by a HV power supply within a fast feedback loop comparing the amplitude of the accelerating voltage in the cavity measured by an RF probe with the required accelerating voltage. The cost-effective 2-cascade magnetron system is shown schematically in FIG. 2. In this embodiment, the required RF signal 1 enters the first low power magnetron 2 to phase lock it via the first circulator 5. The injection-locked output of the low power magnetron is then directed via circulators 5 to enter the high power magnetron 3 to injection-lock its frequency. The output of the high power magnetron is sent to the RF cavity 6 via the first RF coupler 7. The first low-power magnetron operates in a nominal regime. It is frequency-locked by a driving system 12 and controlled in phase comparing phase of the driving signal 1 with phase of the signal measured via the RF probe 11 within a phase feedback loop. This provides the required injection-locking signal for the wideband phase control of the second, high-power magnetron. The phase control is realized by phase modulation of the input injection-locking signal, as it was demonstrated in Ref. [1]. The high-power magnetron 3 is driven by a sufficient injection-locking signal to operate stably with a feeding voltage less than the critical voltage in free run [2]. This allows control of the power via the LLRF 10 of the high-power magnetron over an extended range by varying the current-controlled HV power supply 8 that biases the main HV supply 9 within the feedback loop. Thus one can achieve the quite fast power control with highest efficiency in the range of 10 dB avoiding redistribution of the RF power into a dummy load unlike Refs. [1,3]; the only purpose for the loads 4 in this embodiment is to protect circuitry from unintended reflected signals.

Proof-of-Principle of the Invention

Proof-of-Principle of the invented technique was demonstrated with 2.45 GHz, 1 kW magnetrons operating in pulsed and CW modes, [2].

Figure 3:
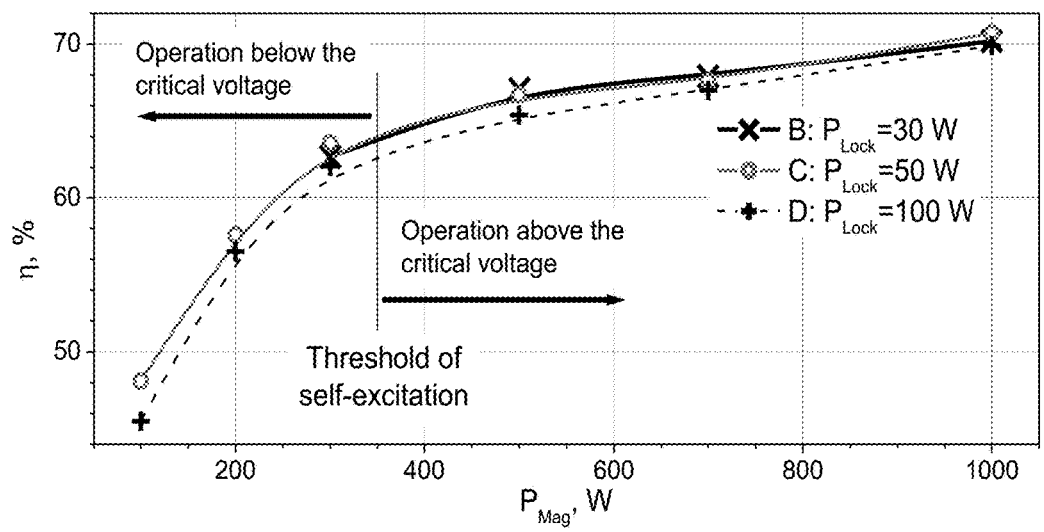
FIG. 3 is the absolute efficiency and the range of power control of the 1.2 kW, CW magnetron driven by a resonant (injection-locking) signal for different values of the locking power. Solid lines show the range of power control vs. $P_{Lock}$. The magnetron filament power consumption was not included in the efficiency determination.

The experiments in CW mode demonstrated the capability of power control over the range of 10 dB, with the efficiency remaining quite high over all the range of power control, given sufficient power of the locking signal, as seen in FIG. 3. The average efficiency of power control drops less than by 20% for power variation over a 10 dB range. Although the maximum efficiency of the tested magnetron was 70%, modern high power magnetrons operate with efficiencies closer to 88%.

Figure 4:
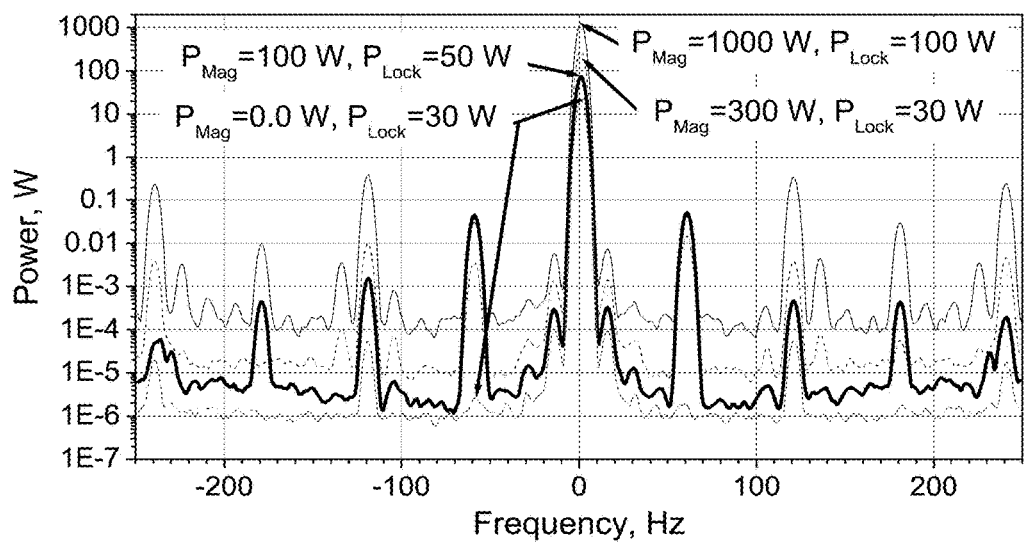
FIG. 4 is the carrier frequency offset at various powers of the magnetron and the locking signal. The trace $P_{Mag}$=0.0 W, $P_{Lock}$=30 W shows the offset of the injection-locking signal when the magnetron high voltage power supply is OFF.

Being injection locked, the magnetron provides precise frequency stability of the output signal to control of the output power over a 10 dB range as shown in FIG. 4. With sufficient injection-locking signal power, the magnetron produces no more than −50 dBc noise over 10 dB range of output power.

Figure 5:
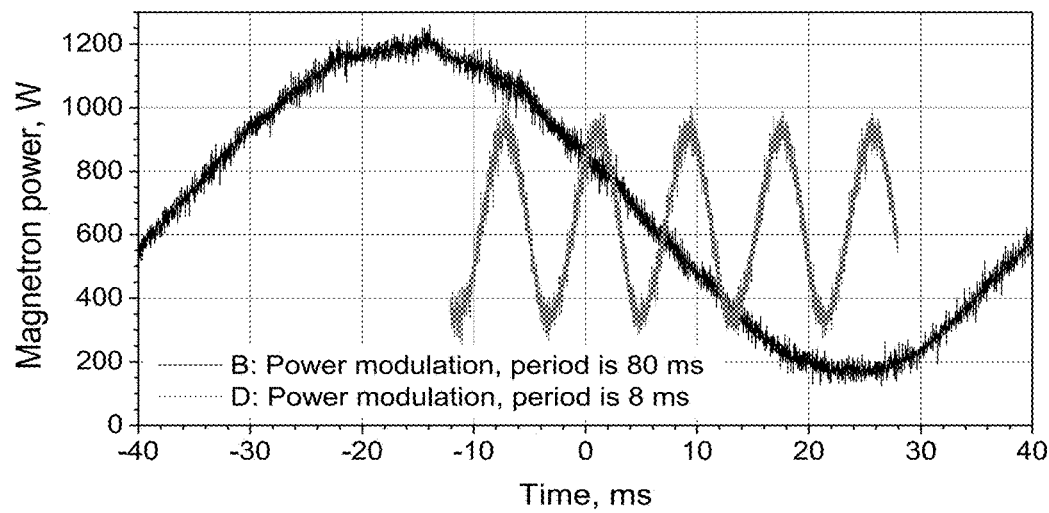
FIG. 5 is the modulation of the magnetron power by modulation of the magnetron current, obtained by controlling the SM445G HV switching power supply within a current feedback loop.

The 2.45 GHz transmitter model demonstrates capability for dynamic power control that is necessary for superconducting accelerators as shown in FIG. 5.

Normally, the bandwidth of the invented power control technique is limited by the bandwidth of magnetron current regulation. Presently, one estimates this bandwidth up to 10 kHz without compromise of the transmitter efficiency. Due to the bandwidth of the phase control in the MHz range, [1], the phase pushing arising from the current control of the high-power magnetron can be compensated to a level of about −60 dB or better. It is suitable for various superconducting accelerators.

The realization of the invented technique of power control of frequency-locked cascaded magnetron transmitters is very promising for high-power RF sources for superconducting and normal-conducting high-power accelerators.

Model of Operation

Detailed consideration of the kinetic simplified model describing the radial and azimuthal drift of the charge in a conventional magnetron driven by a resonant (injection-locking) signal is presented in Ref. [4]. Below we present a simple estimate of the power control range vs. the power of the locking signal.

As it follows from performance charts of typical magnetrons, [6], the minimum magnetron power, $P_{min}$, is usually ~⅓ of the nominal power, $P_{nom}$, and corresponds to the threshold voltage of self-excitation. For commercial magnetrons, as it is noted in Ref. [7], the energy of the RE field in the interaction space is approximately 3 times less than the energy stored in the magnetron RE system including the interaction space and cavities; half of the energy in the interaction space is associated with the RE field in the synchronous wave. Thus, an injection of the resonant driving wave with power $P_{Lock}$ in the magnetron RF system, as it follows from the law of energy conservation increases the energy stored in the RF system. From the point of view of the magnetron start up, it is equivalent to the decrease of the critical magnetron voltage, $U_C$, by $$\Delta U \sim U_C (1-(P_{S\ min}/(P_{S\ min}+P_D/6))^{1/2}). \quad (2)$$

With the magnetron dynamic impedance $Z_D$, the minimum current $I_{minD}$ can be estimated to be:

$$I_{minD} \sim I_{min} - \Delta U/Z_0, \quad (3)$$

where $I_{min}$ minimum current in free run. The power range, $R_D$, allowable for regulation in the driven magnetron one estimates at the nominal magnetron current, $I_{nom}$, as:

$$R_D = P_{nom}/P_{minD} \approx (I_{nom}/I_{minD}). \quad (4)$$

For the 1 kW magnetron model considered in Ref. [4] at $P_{Lock} \sim -10$ dB of the nominal power one obtains: $R_D \sim 10$ dB. As it is shown in FIG. 3, the estimations correspond to measured results.

Figure 6:
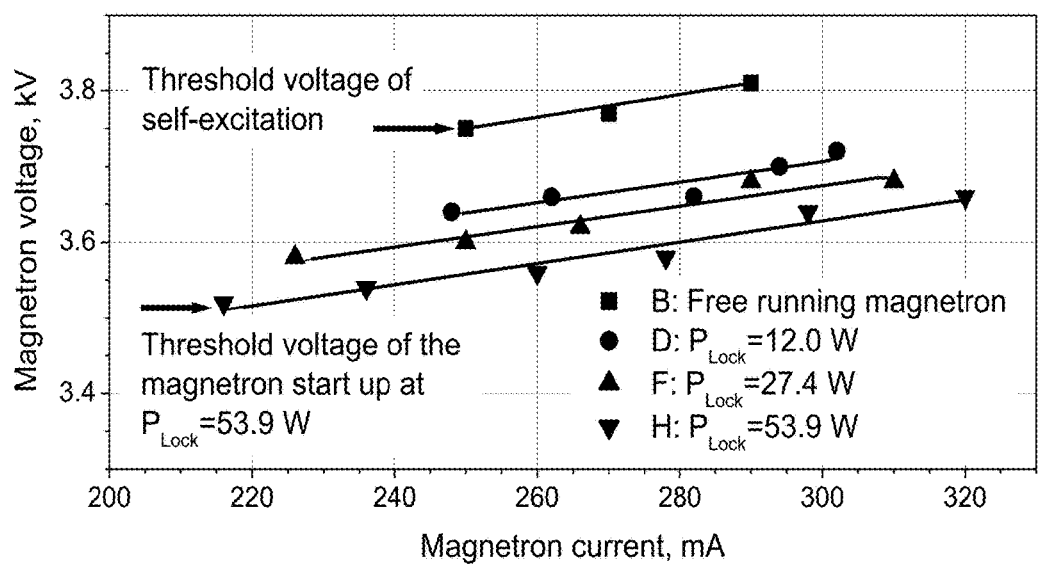
FIG. 6 is shows the V-I curves for different values of locking power of the magnetron tube described in this patent application. The Hartree voltage or Kapitza critical voltage is shown as the threshold voltage to create oscillations and produce power without an injection locking signal.

Many people familiar with the operation of magnetron power sources understand their operation based on V-I plots. FIG. 6 shows the V-I plots for the operation of our subcritical magnetron that show strait-line fits for each value of the locking power. Although these measurements correspond to a new subcritical operating mode, the straight line behavior indicates that the loss of coherence in the magnetron is insignificant and should relatively low level noise.

Application to Superconducting RF Particle Accelerators

Modern superconducting accelerators require highly efficient megawatt-class RF sources with dynamic phase and power control to compensate changes of the accelerating field in Superconducting RF (SRF) cavities due to microphonics, Lorenz force detuning, etc. That is, the small changes in cavity dimensions due to sonic vibrations and to forces from normal operation induce time varying frequency variations that, due to the high quality factor of superconducting cavities (typical loaded quality factors are in the range $10^7$-$10^8$) can destroy the beam quality. This can cause beam losses that can destroy accelerator components or make the beam unusable for many applications. It is known that these effects can be mitigated if the power sources feeding the cavities can react to the changes in the cavities by controlling their phase and power with the proper low level RF system.

Magnetron power sources have long been considered inappropriate for many high-power SRF applications because they are essentially oscillators that operate over a small range of output power that is insufficient and too slow to control microphonics. Some recent studies that use vector power control to provide power control with sufficient bandwidth look promising, but they are effectively diverting some of the power of the magnetrons into dummy loads that heat water, representing an intrinsic inefficiency of these methods.

Unlike these vector power control techniques that manage the accelerating voltage in the SRF cavity by redistribution of magnetron power between the cavity and a dummy load (the magnetron in this method always operates at nominal power), our innovative technique directly controls the output power of the magnetron, without a dummy load, to achieve the highest possible operating efficiency. This is realized by a wide range of power control made possible by operating with subcritical cathode voltage, i.e. below the level needed for self-excitation of the tube, where the injection-locking signal creates the conditions to excite the magnetron and is thereby extremely effective to control its phase, frequency, and output power. This innovative technique has been demonstrated in experiments that show a wide range of power control (up to 10 dB) with low phase noise and precise frequency stability.

Other Applications

Applications include marine radar, microwave assisted sintering of ceramics and other materials, and microwave assisted processes in the chemical industry. A likely profitable usage is RF transmitters for TV and high frequency radio, where the efficiency and cost of magnetrons are significantly better than for other choices.

Previous Patent References

Previous patent references related to magnetron cathode voltage operation below or near the critical or Hartree voltage are listed below. We were unable to find any previous patents where the magnetron operation was significantly below the critical voltage and we found none that used the power from the injection-locking signal to enable operation with the cathode below the critical value.

REFERENCES CITED

U.S. Patent Documents

U.S. Pat. No. 2,576,108 Amplitude Modulation of Magnetrons
U.S. Pat. No. 2,620,467 Amplitude Modulation of Magnetrons, RCA Other Patent Documents GB541120A Improvements relating to the modulation of magnetron oscillators
GB2235775A Magnetron RF generation for electron paramagnetic resonance Other Publications

[1] G. Kazakevich, EIC 2014, TUDF1132_Talk, http:appora.fnal.gov/pls/eic14/agenda.full
[2] G. Kazakevich, R. P. Johnson, U. Flanagan, F. Marhauser, V. Yakovlev, B. Chase, V. Lebedev, S. Nagaitsev, R. Pasquinelli, N. Solyak, K. Quinn, D. Wolff, V. Pavlov, NIM A 760 (2014) 19-27,
[3] B. Chase, R. Pasquinelli, E. Cullerton, P. Varghese, JINST, 10, P03007, 2015.
[4] G. Kazakevich, V. Lebedev, V. Yakovlev, V. Pavlov, NIM A 839 (2016) 43-51.
[5] G. Kazakevich, R. Johnson, M. Neubauer, V. Lebedev, W. Schappert, V. Yakovlev, TUA2CO03, NAPAC 2016 Conference, Chicago, Ill., USA.
[6] G. B. Collins, from "Microwave Magnetrons", New York, McGraw-Hill Book Co., 1948.
[7] P. L. Kapitza, HIGH POWER ELECTRONICS, Sov. Phys. Uspekhi, V 5, #5, 777-826, 1963.

The invention claimed is:

1. A system for powering an accelerating cavity, comprising:
   a first power source configured to receive an input injection-locking signal and produce an injection-locked first output signal using the input injection-locking signal;
   a second power source coupled to the first power source and configured to receive the injection-locked first output signal and produce a second output signal, the second power source including a high-power magnetron receiving a cathode voltage, the cathode voltage controlling a power of the second output signal; and
   a voltage supply system coupled to the second power source and configured to control the power of the second output signal by providing a subcritical feeding voltage as the cathode voltage, the subcritical voltage below a critical voltage needed for self-excitation of the high-power magnetron.

2. The system of claim 1, wherein the voltage supply system comprises:

a probe configured to measure an accelerating voltage signal in the accelerating cavity; and a power feedback loop configured to control the power of the second output signal using the measured accelerating voltage signal.

3. The system of claim 2, wherein the voltage supply system comprises:

a low-power high-voltage (HV) power supply;

a main HV power supply coupled to the low-power HV power supply and configured to be biased by the low-power HV power supply; and a controller configured to control the low-power HV power supply using the measured accelerating voltage signal.

4. The system of claim 2, wherein the high-power magnetron is configured to injection-lock a frequency of the high-power magnetron using the received injection-locked first output signal.

5. The system of claim 1, wherein the first power source comprises a solid state amplifier.

6. The system of claim 1, wherein the first power source comprises a low-power magnetron configured to be driven and phase-locked by the input injection-locking signal.

7. The system of claim 6, further comprising a probe configured to measure an accelerating voltage signal in the accelerating cavity, and wherein the low-power magnetron is configured to be phase-locked by phase modulation of the input injection-locking signal using a phase feedback loop comparing a phase of the input injection-locking signal with a phase of the measured accelerating voltage signal.

8. The system of claim 7, further comprising a phase controller configured to frequency-lock the low-power magnetron.

9. The system of claim 7, wherein the voltage supply system comprises a power feedback loop configured to control the power of the second output signal using the measured accelerating voltage signal.

10. The system of claim 9, wherein the voltage supply system comprises:

a low-power high-voltage (HV) power supply;

a main HV power supply coupled to the low-power HV power supply and configured to be biased by the low-power HV power supply; and a controller configured to control the low-power HV power supply using the measured accelerating voltage.

11. The system of claim 6, wherein the low-power magnetron and the high-power magnetron are configured to operate in a continuous wave (CW) mode.

12. The system of claim 6, wherein the low-power magnetron and the high-power magnetron are configured to operate in a pulsed mode.

13. A method for operating a magnetron power source, comprising:

driving a first power source using an input injection-locking signal;

producing an injection-locked first output signal by processing the input injection-locking signal using the first power source;

driving a second power source using the injection-locked first output signal, the second power source including a high-power magnetron receiving a cathode voltage;

producing a second output signal using the high-power magnetron, the second output signal having a power being a function of the cathode voltage; and providing a subcritical feeding voltage as the cathode voltage, the subcritical voltage below a critical voltage needed for self-excitation of the high-power magnetron.

14. The method of claim 13, wherein driving the first power source using the input injection-locking signal comprises:

driving a low-power magnetron using the input injection-locking signal; and phase-locking the low-power magnetron using the input injection-locking signal.

15. The method of claim 13, further comprising powering an accelerating cavity using the second output signal.

16. The method of claim 15, wherein providing the second output signal comprises:

measuring an accelerating voltage in the accelerating cavity; and controlling the power of the second output signal using the measured accelerating voltage signal.

17. The method of claim 16, wherein controlling the power of the second output signal comprises:

biasing main high-voltage (HV) power supply using a low-power HV power supply; and controlling the low-power HV power supply using the measured accelerating voltage.

18. The method of claim 17, further comprising injection-locking a frequency of the high-power magnetron using the received injection-locked first output signal.

19. The method of claim 18, wherein driving the first power source using the input injection-locking signal comprises:

driving a low-power magnetron using the input injection-locking signal; and phase-locking the low-power magnetron using the input injection-locking signal.

20. The method of claim 19, wherein phase-locking the low-power magnetron using the input injection-locking signal comprises phase modulating the input injection-locking signal using a phase feedback loop comparing a phase of the input injection-locking signal with a phase of the measured accelerating voltage signal.

* * * * *